US007022545B2

(12) United States Patent
Yamada et al.

(10) Patent No.: US 7,022,545 B2
(45) Date of Patent: Apr. 4, 2006

(54) PRODUCTION METHOD OF SIC MONITOR WAFER

(75) Inventors: Isao Yamada, Himeji (JP); Jiro Matsuo, Kyoto (JP); Noriaki Toyoda, Himeji (JP); Kazutoshi Murata, Tamano (JP); Naomasa Miyatake, Tamano (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 0 days.

(21) Appl. No.: 10/502,537

(22) PCT Filed: Jan. 10, 2003

(86) PCT No.: PCT/JP03/00175

§ 371 (c)(1), (2), (4) Date: Oct. 7, 2004

(87) PCT Pub. No.: WO03/071588

PCT Pub. Date: Aug. 28, 2003

(65) Prior Publication Data

US 2005/0042800 A1 Feb. 24, 2005

(30) Foreign Application Priority Data

Feb. 22, 2002 (JP) ............................ 2002-045725

(51) Int. Cl.
*H01L 21/02* (2006.01)
*H01L 21/205* (2006.01)
*B24C 1/00* (2006.01)
*C30B 29/36* (2006.01)

(52) U.S. Cl. ...................... 438/105; 438/690; 438/692; 438/507; 438/931; 427/585; 427/589

(58) Field of Classification Search ................ 438/689, 438/690, 691, 692, 680, 759, 931, 507, 105; 427/585, 589
See application file for complete search history.

(56) References Cited

U.S. PATENT DOCUMENTS 6,365,460 B1 * 4/2002 Yamada et al. ............ 438/268

(Continued)

FOREIGN PATENT DOCUMENTS

JP 11-087202 A * 3/1999

(Continued)

*Primary Examiner*—Mary Wilczewski
*Assistant Examiner*—Seth Barnes
(74) *Attorney, Agent, or Firm*—Oliff & Berridge, PLC

(57) ABSTRACT

The present invention has its object to obtain an SiC monitor wafer which can flatten the surface until particle detection is possible. SiC of a crystal system 3C is deposited on a substrate by a CVD (Chemical Vapor Deposition) method, and the SiC is detached from a substrate. After the SiC surface is flattened by using mechanical polishing alone or in combination with CMP (Chemo Mechanical Polishing), GCIB (Gas Cluster Ion Beam) is irradiated to the surface until the surface roughness becomes Ra=0.5 nm or less and the impurity density of the wafer surface becomes $1*10_{11}$ atoms/$cm_2$ or less to produce the SiC monitor wafer.

7 Claims, 5 Drawing Sheets

U.S. PATENT DOCUMENTS

| | | | | |
|---|---|---|---|---|
| 6,375,790 | B1 * | 4/2002 | Fenner | 156/345.28 |
| 6,534,380 | B1 * | 3/2003 | Yamauchi et al. | 438/455 |
| 6,687,089 | B1 * | 2/2004 | Chiba et al. | 360/235.4 |
| 6,908,778 | B1 * | 6/2005 | Strumpell et al. | 438/22 |
| 2004/0241975 | A1 * | 12/2004 | Faure et al. | 438/607 |
| 2005/0020084 | A1 * | 1/2005 | Richtarch | 438/692 |

FOREIGN PATENT DOCUMENTS

| | | | | |
|---|---|---|---|---|
| JP | 11-092295 | A | * | 4/1999 |
| JP | 11-121311 | A | * | 4/1999 |
| JP | 11-121312 | A | * | 4/1999 |
| JP | 11-121315 | A | * | 4/1999 |
| JP | 11-238690 | A | * | 8/1999 |
| JP | 11-340108 | A | * | 12/1999 |
| JP | 2000-243706 | A | * | 9/2000 |

* cited by examiner

10 : SILICON CARBIDE WAFER
12 : [111]DIRECTION
C : CARBON ATOM
Si : SILICON ATOM

PRIOR ART

PRODUCTION METHOD OF SIC MONITOR WAFER

TECHNICAL FIELD

The present invention relates to a production method of an SiC monitor wafer which is introduced into a semiconductor process device and has an ultra-flat and highly pure surface.

BACKGROUND ART

A semiconductor device having a silicon single crystal as a substrate goes through an oxidization process for forming an oxide film on the surface of a silicon substrate (silicon wafer), a diffusion process for diffusing impurities, a low pressure CVD (LPCVD) process for forming a silicon nitride film, a polycrystal silicon film (polysilicon film) under reduced pressure and the like, and has a very small circuit formed on the silicon wafer. Semiconductor production facility called diffusion equipment, an LPCVD equipment and the like are used for these processes. Each of these equipment is composed of a furnace part into which a plurality of silicon wafers are inserted and which heats the silicon wafer main body to high temperature, a gas introduction part for supplying a reactive gas into the furnace, an exhaust part and the like, and a number of silicon wafers can be simultaneously processed (batch processing) therein. FIG. 5 shows an example of a vertical type of LPCVD device.

In FIG. 5, a CVD device 10 is provided with a heater not shown at an inner circumferential surface of a furnace body 12 so that an inside thereof can be heated and maintained at a high temperature, and the CVD equipment is also connected to a vacuum pump not shown so that the inside can be pumped down to 10 Torr or less. The inside of the furnace body 12 is provided with a process tube 14 formed of a high purity quartz and silicon carbide (SiC).

A boat pedestal 18 is provided at a center portion of a base 16 covered with the process tube 14, and a wafer boat 20 in a vertical rack shape formed of SiC, quartz, or the like is placed on this boat pedestal 18. A number of silicon wafers 22 to form semiconductor devices such as a large scale integrated circuit (LSI) and the like are held with appropriate spaces between them in a vertical direction of the wafer boat 20. A gas introduction pipe 24 for introducing a reaction gas into the furnace and a thermocouple protecting tube 26 containing a thermocouple for measuring the temperature inside the furnace are placed at the sides of the wafer boat 20.

In the CVD equipment 10 constituted as above, a number of silicon wafers 22 are placed inside the furnace via the wafer boat 20. The pressure of the inside of the furnace is reduced to 100 Torr or less, the inside of the furnace is heated to a high temperature of, for example, 800° C. to 1200° C., and a carrier gas such as $H_2$ and a reaction gas (raw material gas) such as $SiCl_4$ are introduced into the furnace via the gas introduction pipe 24, whereby a polycrystal silicon film (polysilicon film) and a silicon oxide film ($SiO_2$) are formed on the surface of the silicon wafer 22.

In the CVD device 10 as described above, a plurality of monitor wafers 30 are placed to mingle with the silicon wafers 22 at appropriate positions in the vertical direction of the wafer boat 20 to check the state of particles attached to the silicon wafer 22 and to check whether a film of predetermined thickness is formed on the silicon wafer 22 and the like. An Si single crystal wafer with surface roughness of about Ra=0.25 nm is generally used for a monitor wafer which is used to perform management of the film thickness of the formed thin film, particles and the like as described above. Though very flat surface as described above is obtained with the silicon single crystal, the conventional monitor wafer cannot be reused by washing the film with acid or the like when a polysilicon film or a silicon oxide film is formed, and it is thrown away after one use, which makes it very uneconomical. Consequently, SiC wafers, which are excellent in anticorrosion against nitric acid and the like, facilitate removal of deposits caused by etching, and can be repeatedly used for a long period of time, receive attention.

On the other hand, SiC has high hardness, then it is difficult to produce an ultra-flat surface. Polishing with use of a diamond abrasive grain is generally performed, but it easily gives a scratch damage onto the wafer surface by the abrasive grain or the SiC itself which is fallen away. Concerning the surface cleanness, there exists the problem of impurities mixing in this grinding process.

With the prior SiC polishing technique, it is not possible to produce an SiC monitor wafer having an ultra-flat and clean surface at low cost. For example, with the design rule of 0.13 μm in mind, it is necessary to detect a particle (dust) of at least 0.1 μm. However, with the SiC polishing technique corresponding to volume production of the present situation, the average roughness is about Ra=20 nm, and therefore it is confirmed that the particle detection cannot be performed with this surface roughness.

The present invention is made in view of the above-described problem of the prior art, and has its object to provide the SiC monitor wafer production method which can make a surface flat until the particle detection becomes possible.

DISCLOSURE OF THE INVENTION

In order to attain the above-described object, in a production method of an SiC monitor wafer according to the present invention, 3C-SiC is grown in a [111] direction by CVD. A C surface of SiC is polished and is irradiated with the GCIB by an Ar gas. Further, $CF_4$, $SF_6$, $NF_3$, $CHF_3$ Or $O_2$ alone or a mixture gas of them is used as a gas seed of the GCIB.

More specifically, a production method of an SiC monitor wafer according to the present invention comprises the steps of depositing SiC of crystal system 3C on a substrate by a CVD (Chemical Vapor Deposition) method; detaching the SiC from the substrate; flattening the SiC surface by using mechanical polishing alone or in combination with CMP (Chemo Mechanical Polishing); thereafter, irradiating the surface with GCIB (Gas Cluster Ion Beam) until the surface roughness becomes Ra=0.5 nm or less, and impurity density of the wafer surface becomes $1\times10^{11}$ atoms/$cm^2$ or less to thereby produce the SiC monitor wafer.

Further, in the CVD process, 3C-SiC crystal may be oriented and grown in a direction of [100] or [110] or [111], and crystal orientation may be made uniform, whereby etching rate anisotropy is avoided at the time of the CMP and GCIB irradiation, thereby producing the SiC monitor wafer.

In the machining step in which mechanical polishing alone or in combination of CNLP is used before the GCIB is irradiated, the surface roughness (PV value) in an area of 100 μm of the wafer surface may be flattened to 5 nm to 50 nm, and thereafter an ultra-flat surface may be produced by the GCIB.

When mechanically polishing the SiC surface, a C surface of the 3C-SiC crystal is formed and made a surface to be polished, and a larger etching rate is obtained as compared with Si surface polishing. Further, when irradiating the SiC surface with the GCIB, a C surface of the 3C-SiC crystal is made a surface to be irradiated, and a larger etching rate is obtained as compared with the Si surface irradiation. In addition, by using $CF_4$, $SF_6$, $NF_3$, $CHF_3$ or $O_2$ alone or a mixture gas of them as a gas seed which is irradiated to the wafer surface, F radical generated on the surface may be utilized to promote chemical reaction on the SiC surface so that a large etching rate is obtained. Furthermore, after etching is carried out by using $CF_4$, $SF_6$, $NF_3$, $CHF_3$ or $O_2$ alone or a mixture gas of them as a gas seed of GCIB, which is irradiated to the wafer surface, Ar gas cluster may be irradiated to ultra-flatten the surface.

The present invention is to obtain an ultra-flat and clean SiC surface at low cost by using a crystal orientation control, selection of the Si surface/C surface of SiC, and reactivity of SiC and a gas seed.

When ion etching is conducted, an ideal incident angle of ion exists to increase a spattering rate. When the crystal orientation of SiC is not uniform, even if the ion beam is irradiated uniformly, the etching depth differs for each crystal grain composing the wafer. This problem is solved by orientation growth. The (111) surface and the (1-1-1-) surface of SiC are not equivalent. The former is called the Si surface and the latter is called the C surface. As for permeability for oxygen ions in the $SiO_2$ film formed on the SiC surface, for example, $SiO_2$ on the Si surface has less permeability, that is, larger oxidation resistance. As for etching, difference between the C surface and the Si surface is expected. Further, by using $CF_4$, $SF_6$, $NF_3$, $CHF_3$, or $O_2$ alone, or a mixture gas of them as the gas seed of the GCIB, the reaction of the SiC surface and F radical proceeds, and a larger etching rate as compared with the case of an Ar gas is obtained. In the case of these gas seeds, the etching rate is large, but flattening performance lags behind, and therefore final finishing is performed by an Ar gas.

BEST MODE FOR CARRYING OUT THE INVENTION

Hereinafter, a preferred embodiment of a production method of an SiC monitor wafer according to the present invention will be explained in detail with reference to the accompanying drawings.

Figure 4:
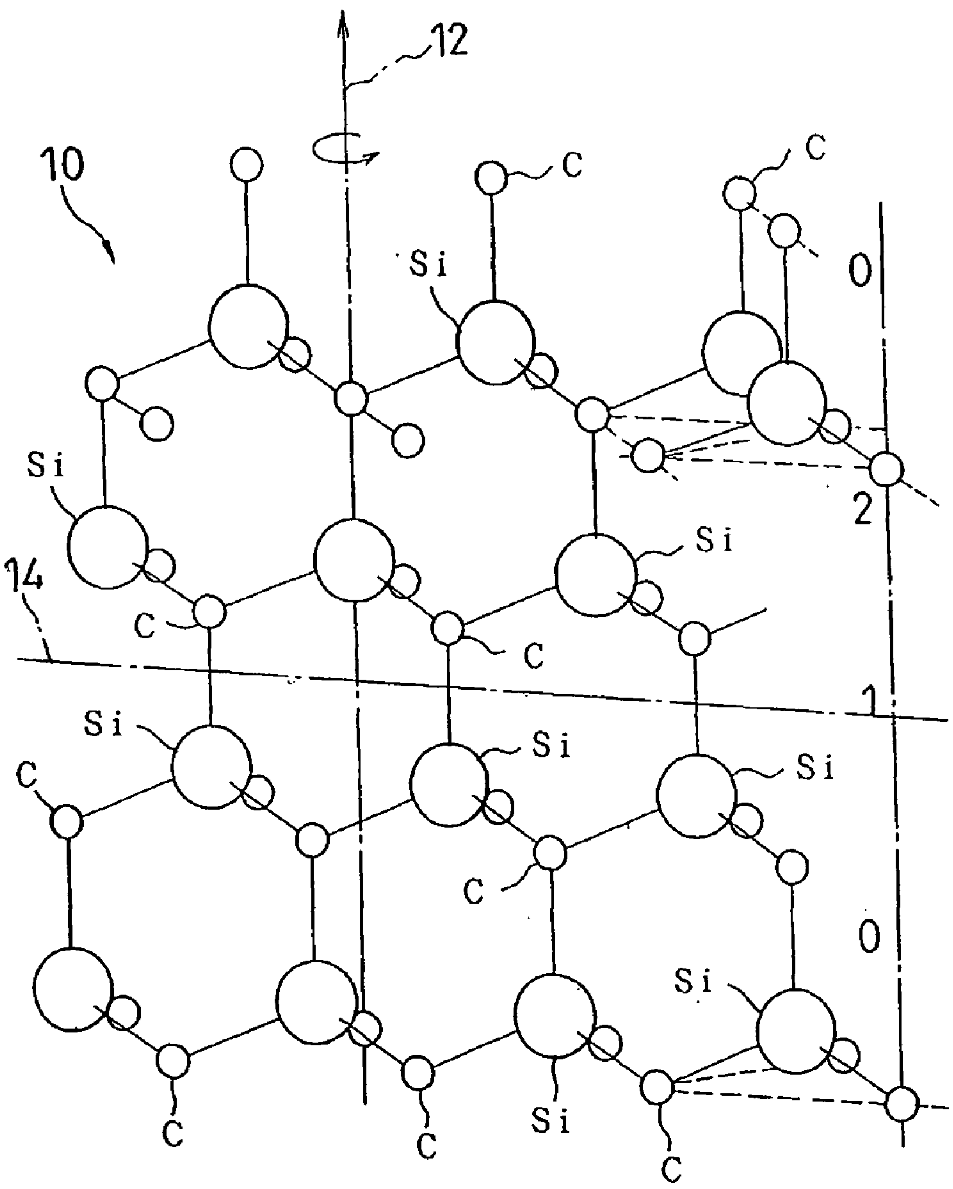
FIG. 4 is a view showing a crystal structure of an SiC wafer.
Figure 5:
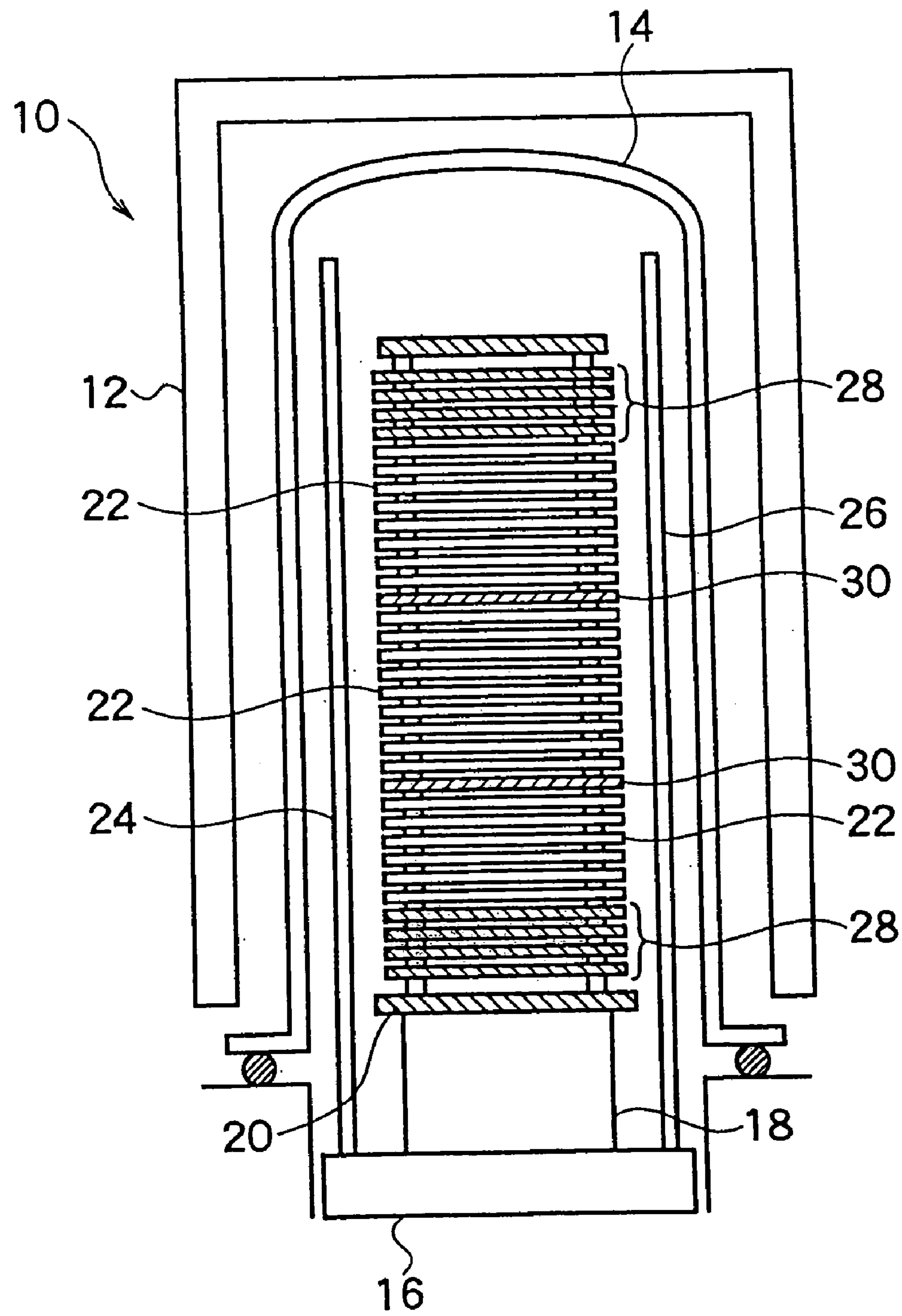
FIG. 5 is an explanatory view of a low pressure CVD device.

As shown in FIG. 4, SiC is a substitutional type of diamond in its crystal structure and has a structure in which carbon atoms C and silicon atoms Si form a hexagonal lattice and a layer in which carbon atoms C are arranged and a layer in which silicon atoms Si are arranged are alternately placed along a direction of [111] axis. The bonding force between the layer in which the carbon atoms C are arranged and the layer in which the silicon atoms Si are arranged is weaker than a bonding force of the other parts, and therefore they tend to be cut in a direction parallel to a (111) surface. Therefore, SiC is easily cut in a direction parallel to the (111) surface as a border of the layer of the carbon atoms C and the layer of the silicon atoms Si, and the layer of carbon atoms C and the layer of silicon atoms Si appear on the cutting plane.

This is the same when polishing is performed, when (111) is polished, the layer of silicon atoms Si appears on its surface and when the opposite surface is polished, the layer of carbon atoms C appears. Accordingly, in the (111) SiC wafer, one side surface is always a so-called Si surface in which the layer of silicon atoms Si appears, and the other side surface is a so-called C surface in which the layer of carbon atoms C appears.

Figure 1:
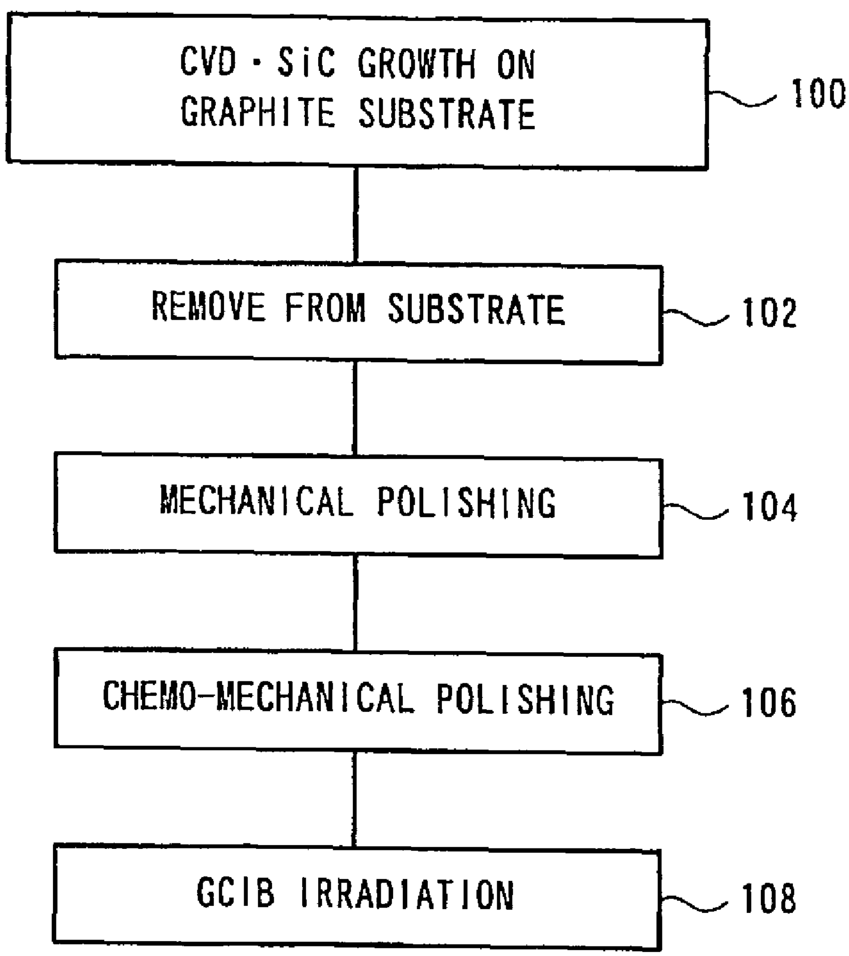
FIG. 1 is a flowchart showing process steps of a production method of an SiC monitor wafer according to an embodiment.

The SiC monitor wafer production method according to this embodiment is carried out as follows. A flowchart of the production process will be shown in FIG. 1. As shown in FIG. 1, the SiC wafer is produced on a graphite base material by the CVD so that the surface of the SiC wafer becomes (111) (step 100), and the base material is combusted so that the SiC wafer is detached (step 102). The surface of the SiC wafer thus obtained is mechanically polished (step 104), then CMP polishing for the wafer C surface is carried out (step 106), and finally the GCIB is irradiated to finish the so-called polishing operation (step 108).

Figure 2A:
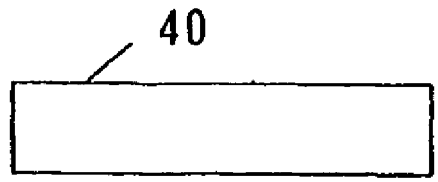
FIG. 2A–2D is a flowchart of production process of the SiC wafer.
Figure 2B:
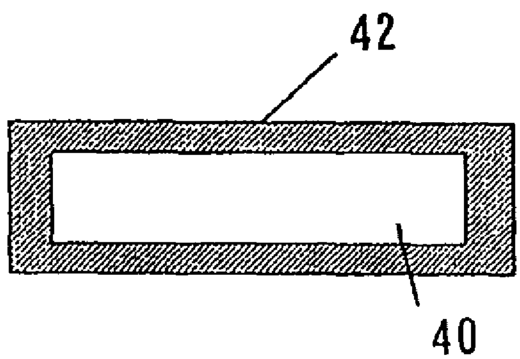
Figure 2C:
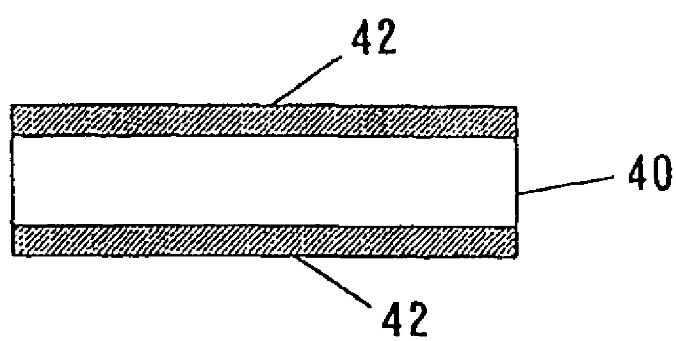
Figure 2D:
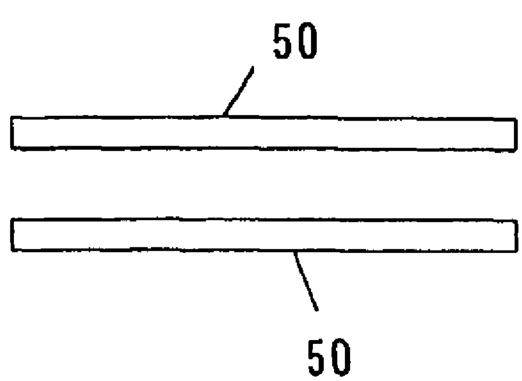

On producing the SiC monitor wafer, the SiC wafer is firstly produced. As for this, a disc-shaped graphite base material 40 in a predetermined size composed of high purity graphite corresponding to the size of the SiC wafer to be produced is made as shown in FIG. 2A. Thereafter, the disc-shaped graphite base material 40 is put into the CVD equipment, then the temperature of the inside of the furnace is heated to and kept at a predetermined temperature (for example, 1000 to 1600° C.), and the inside of the furnace is controlled to be predetermined pressure (for example, 100 Torr). Subsequently, $SiCl_4$, $C_3H_8$ and the like to be materials of SiC as well as a hydrogen gas ($H_2$) are supplied by 5 to 20% in volume %, and an SiC layer 42 of 0.3 to 1 mm is formed on the surface of the graphite base material 40 (FIG. 2B). Thereafter, the graphite base material 40 is taken out of the CVD equipment, and the perimeter surface of the SiC layer 42 is polished and cut by machining, whereby the perimeter surface of the graphite base material 40 is exposed (FIG. 2C). Subsequently, the graphite base material 40 sandwiched by the SiC layers 42 is put into the furnace at 900 to 1400° C., to which oxygen is supplied, and the graphite base material 40 is combusted and removed, whereby two SiC wafers 50 are obtained (FIG. 2D). Thereafter, the SiC wafers are polished.

Plishing processing is carried out so that the SiC wafer 50 thus obtained can be used as a monitor wafer. After the wafer 50 is firstly polished to Ra=0.02 μm using a diamond abrasive grain, the CMP polishing is carried out. With use of colloidal silica (grain diameter of 70 nm) as an abrasive material, pH of slurry is adjusted to 10 to 11 by addition of alkali. The polishing time is twelve hours. The surface for which CMP is carried out is the C surface. An etching rate at temperature of 55° C. is 0.1 μm/h with pH 10, and 0.2 μm/with pH 11. The etching rate becomes further smaller at around the room temperature. On the Si surface, the etching rate is half or less as compared with that on the C surface.

Figure 3:
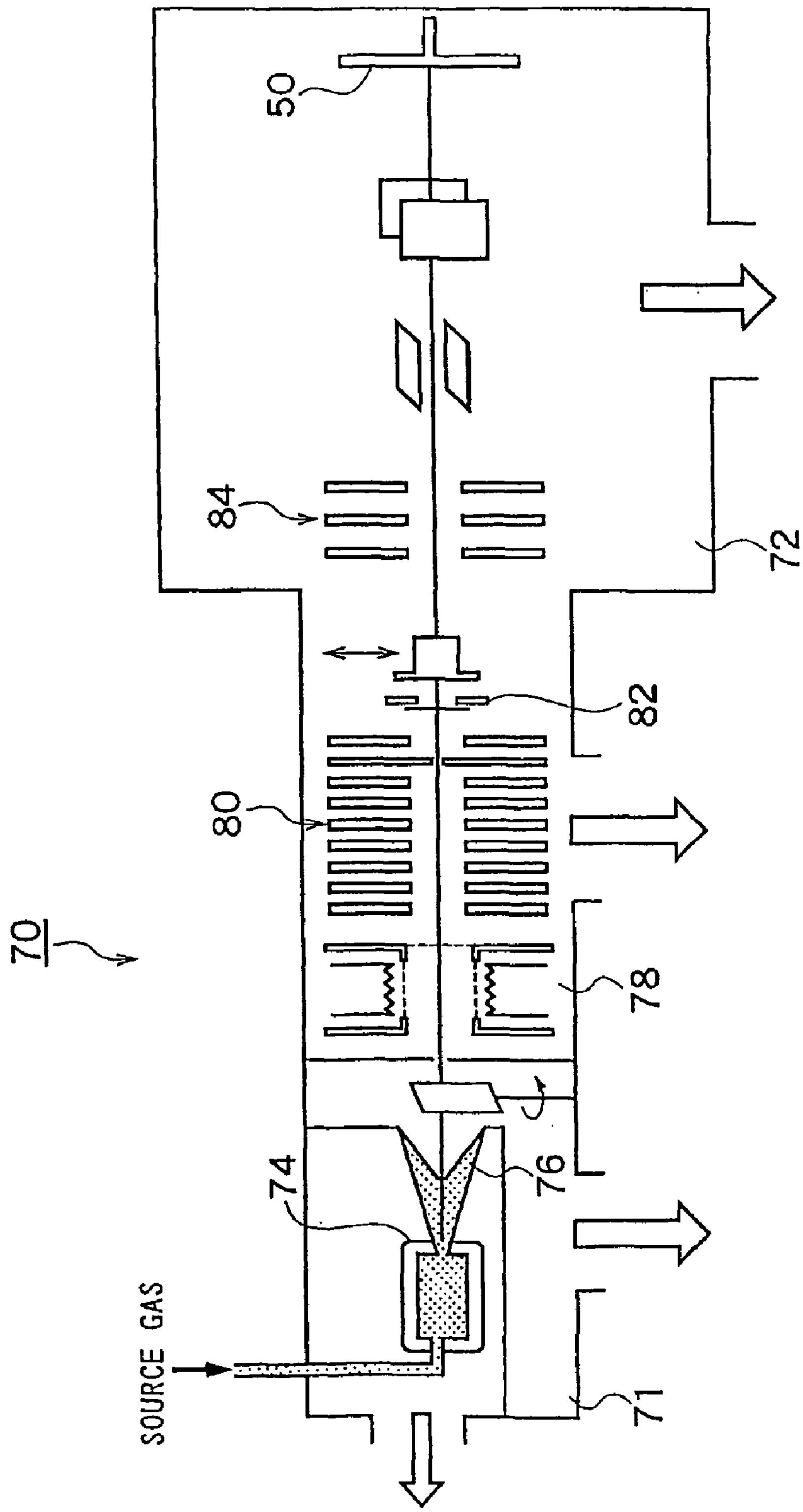
FIG. 3 is a sectional view of GCIB equipment.

Next, the GCIB is irradiated to the wafer for which only mechanical polishing is carried out and also to the wafer for which mechanical polishing and CMP are used in combination, and thereby the wafers are flattened. A GCIB equipment is shown in FIG. 3. As for a GCIB equipment 70, a known one may be used, and for example, as shown in FIG. 3, the device has two vacuum chambers, a source chamber 71 and a main chamber 72, which are operated to exhaust air by a source chamber vacuum pump, and a main chamber vacuum pump. Gas cluster is formed by adiabatic expansion by causing a source gas supplied from a gas cylinder or the like to spout from a nozzle 74 at an supersonic speed. The generated cluster is made to pass through a skimmer 76 and introduced into an ionization section 78 with a beam form being shaped. In this ionization section 78, ionization is carried out by electron collision extracted from filament. On this occasion, in an acceleration section 80, the cluster is accelerated by an electric field and gas cluster ions are selected by the size of the cluster by a deceleration electric field in a deceleration electric section 82, then it is further accelerated in an acceleration section 84 and is irradiated to the wafer 50 as a target to which high voltage is applied. The gas cluster ion irradiated to the wafer 50 is broken as a result of collision with the wafer 50, on which occasion, multibody collision occurs between cluster constituent atoms or molecules and target atoms or molecules, and movement in a horizontal direction relative to the surface of the wafer 50 becomes prominent, and as a result, smoothing in a lateral direction relative to the surface of the wafer 50 becomes possible. As a result that sputtered atoms move in a lateral direction on the surface of the wafer 50, the raised portions on the surface are mainly sputtered and ultra precise polishing flat in an atomic size can be obtained.

As a source gas to be introduced, $CF_4$, $SF_6$, $NF_3$, $CHF_3$, or $O_2$ alone, or a mixture gas of them with large etching rate is used. With these kinds of gases, etching speed is large, but flattening performance lags behind, and therefore one, or two or more kinds of gas or gases, such as, for example, a compound carbon dioxide gas, as well as argon, a nitrogen gas, an oxygen gas and the like can be solely used or mixed and used.

By the GCIB irradiation as described above, the surface roughness is improved to an atom level size. In the gas cluster ion beam, the energy which the ions have is lower unlike ordinary ion etching, therefore making desired ultra precise polishing possible without giving a damage to the surface of the wafer. As for irradiation of the gas cluster ion beam to the surface of the substrate, it is preferable to irradiate the beam in the substantially vertical direction relative to the surface.

Table 1 provides the typical irradiation conditions by the above-described GCIB.

TABLE 1

| | | | |
|---|---|---|---|
| Gas seed | $CF_4$ | Irradiation area | 7 inches in diameter |
| Acceleration voltage | 15 kV | Beam current | 50 μA |
| Ionization voltage | 300 V | Ionization current | 150 mA |
| Irradiation time | 1 h | | |

The depth of etching is obtained from difference of elevation between the irradiated portion and the non-irradiated portion with masking being applied. Table 2 provides a summary of the effect of flattening with $CF_4$ irradiation.

TABLE 2

| Surface | Etching rate | Ra |
|---|---|---|
| C surface | 1.0 μm/h | 4 nm |
| Si surface | 0.4 μm/h | 20 nm |
| C surface (CMP) | 1.0 μm/h | 1.6 nm |
| Si surface (CMP) | 0.4 μm/h | 4 nm |

The etching rate when $CF_4$ is irradiated to the C surface is 1 μm/h. For the Si surface, it is 0.4 μm/h. With Ar gas cluster irradiation, the etching rates of the C surface and the Si surface become 1/10 as compared with $CF_4$. Throughput becomes extremely low with use of only an Ar gas. After irradiation of $CF_4$, Ar gas cluster is irradiated as final finishing. As a result of observing the surface with AFM, the wafer having the flattest surface is the C surface (using CMP in combination), and the Ra value of the average roughness is 0.2 nm.

TABLE 3

| Surface | Etching rate | Ra |
|---|---|---|
| C surface | 0.1 μm/h | 0.5 nm |
| Si surface | 0.05 μm/h | 10.0 nm |
| C surface (CMP) | 1.10 μm/h | 0.2 nm |
| Si surface (CMP) | 0.05 μm/h | 0.5 nm |

As described above, according to the present embodiment, the direction of the SiC crystal is aligned with [111] by CVD, and by applying CMP and GCIB onto the C surface, and by using a reactive substance such as $CF_4$ as the GCIB gas, the surface of SiC that is difficult to machine can be ultra-flattened. In the above-described embodiment, the case in which the direction of the SiC crystal is aligned with [111] is explained, but the same effects can be obtained when the crystal direction is [100] and [110].

INDUSTRIAL AVAILABILITY

As explained thus far, the present invention is constituted so that SiC of crystal system 3C is deposited on a substrate by the CVD (chemical Vapor Deposition) method and after this SiC is detached from the substrate and the SiC surface is flattened by using mechanical polishing alone or in combination with CMP (Chemo Mechanical Polishing), the GCIB (Gas Cluster Ion Beam) is irradiated to the surface until the surface roughness becomes Ra=0.5 nm or less and the impurity density on the wafer surface becomes $1\times10^{11}$ atoms/$cm^2$ or less, therefore obtaining the excellent effect that the surface of the SiC wafer can be ultra-flattened to the extent that particle detection is possible.

The invention claimed is:

1. A production method of an SiC monitor wafer having an ultra-flat and clean surface comprising the steps of:

depositing SiC of crystal system 3C on a substrate by a CVD (Chemical Vapor Deposition) method;

detaching the SiC from the substrate;

flattening the SiC surface by using mechanical polishing alone or in combination with CMP (Chemo Mechanical Polishing);

thereafter, irradiating the surface with GCIB (Gas Cluster Ion Beam) until the surface roughness becomes Ra=0.5 nm or less, and impurity density of the wafer surface becomes $1\times10^{11}$ atoms/$cm^2$ or less to thereby produce the SiC monitor wafer.

2. The production method of the SiC monitor wafer according to claim 1, wherein:

in the CVD process, 3C-SiC crystal is oriented and grown in a direction of [100] or [110] or [111], and crystal orientation is made uniform, whereby etching rate anisotropy is avoided at the time of CMP and GCB irradiation.

3. The production method of the SiC monitor wafer according to claim 1, wherein:

in the machining step in which mechanical polishing is solely used or used in combination of CMP before the GCIB is irradiated, the surface roughness (PV value) in an area of 100 μm of the wafer surface is flattened to 5 nm to 50 nm, and thereafter an ultra-flat surface is produced by the GCIB.

4. The production method of the SiC monitor wafer according to claim 1, wherein:

when mechanically polishing the SiC surface, a C surface of the 3C-SiC crystal is made a surface to be polished, and a larger etching rate is obtained as compared with Si surface polishing.

5. The production method of the SiC monitor wafer according to claim 1, wherein:

when the SiC surface is irradiated with the GCIB, a C surface of the 3C-SiC crystal is made a surface to be irradiated, and a larger etching rate is obtained as compared with the Si surface irradiation.

6. The production method of the SiC monitor wafer according to claim 1, wherein:

by using $CF_4$, $SF_6$, $NF_3$, $CHF_3$ or $O_2$ alone or a mixture gas of them as a gas of GCIB which is irradiated to the wafer surface, F radical generated on the surface is utilized to promote chemical reaction on the SiC surface and a large etching rate is obtained.

7. The production method of the SiC monitor wafer according to claim 1, wherein:

after etching is carried out by using $CF_4$, $SF_6$, $NF_3$, $CHF_3$ and $O_2$ alone or a mixture gas of them as a gas of GCIB which is irradiated to the wafer surface, Ar gas cluster is irradiated to ultra-flatten the surface.

* * * * *